(12) United States Patent
Olsson

(10) Patent No.: US 6,816,851 B1
(45) Date of Patent: Nov. 9, 2004

(54) METHOD FOR ASSIGNING AND ID TO AN OBJECT IN A DATABASE

(75) Inventor: Bertil Olsson, Kärna (SE)

(73) Assignee: Jema-Jori AB, Karna (SE)

( * ) Notice: Subject to any disclaimer, the term of this patent is extended or adjusted under 35 U.S.C. 154(b) by 393 days.

(21) Appl. No.: 10/030,295

(22) PCT Filed: Jul. 6, 2000

(86) PCT No.: PCT/SE00/01439
§ 371 (c)(1),
(2), (4) Date: May 10, 2002

(87) PCT Pub. No.: WO01/04794
PCT Pub. Date: Jan. 18, 2001

(30) Foreign Application Priority Data

Jul. 9, 1999 (SE) .............................................. 9902640

(51) Int. Cl.$^7$ .............................................. G06F 17/30
(52) U.S. Cl. ...................................... 707/2; 707/103 R
(58) Field of Search ........................... 707/1–10, 103 R

(56) References Cited

U.S. PATENT DOCUMENTS 5,487,139 A * 1/1996 Saylor et al. ................ 345/629
5,652,881 A   7/1997 Takahashi et al.
6,067,604 A * 5/2000 Ramachandran et al. ... 711/149
6,138,125 A * 10/2000 DeMoss ...................... 707/202
6,154,752 A * 11/2000 Ryan ........................ 715/501.1
6,671,738 B1 * 12/2003 Rajchel et al. .............. 709/245

FOREIGN PATENT DOCUMENTS

WO    WO93/05467    3/1993

* cited by examiner

*Primary Examiner*—Jack M Choules
(74) *Attorney, Agent, or Firm*—Harness Dickey

(57) ABSTRACT

The invention relates to a method for assigning an identity to an object (10) in a database, which object has an extension that includes a plurality of coordinate points in a coordinate system representing a multidimensional reality. The method is characterised by the steps of selecting one of the object's coordinate points ($P_0$) and assigning the object an identity (11) based on the coordinates ($x_0, y_0, z_0, t_0$) of said coordinate point. Selecting the dimensions of the coordinate system in a suitable manner, e.g. by allowing them to comprise time, space and alternative embodiments, ensures that all objects in the database have wholly unique identities that are also based on one of the coordinate points of the object. This can be used to advantage in the database structure.

9 Claims, 5 Drawing Sheets

ND ID TO AN
METHOD FOR ASSIGNING AND ID TO AN OBJECT IN A DATABASE

This application is the National Phase under 35 USC§371 of PCT International No. PCT/SE00/01439 which has an International filing date of Jul. 6, 2000, which designated the United States of America, the entire contents of which are hereby incorporated by reference.

TECHNICAL FIELD

The present invention relates to a method for assigning an identity to an object in a database, which object represents an extension that includes a plurality of coordinate points in a coordinate system representing a multidimensional reality.

BACKGROUND ART

Various forms of databases for storing information exist very often in our increasingly computerised world. Information is usually structured in the database in the form of objects which, for instance, may represent a physical article whose properties are stored in the database.

When transferring the physical reality to a database, software comprising a graphical interface is often used, models being drawn into a coordinate system and stored in the database by the software. This is called "writing" or "entering" the model into the database. One or more models are linked to an object, which may also be linked to information about the properties, choice of material, etc. of the object. The geometric models and other properties are stored in documents that are linked to an object by means of references to an object ID. This type of system is well known in CAD (Computer Aided Design), for instance. The information in the database is used in calculations performed by the designer, such as strength calculations, optimisation calculations, collision analyses, etc.

Each object is thus assigned an identity (object ID) in the database, to which object ID the software associates all information (all documents) that relates to this object. Sometimes the identity of the user is stated, but it is more usual for the object to be automatically assigned an ID by the software, possibly in accordance with specified rules.

One problem is that no uniform method exists for assigning object IDs. Usually the object ID is the same as a product number for a physical product, and every manufacturer has its own principles for numbering its products. This means that most databases are incompatible with each other.

Furthermore, a product number is not unique but may be shared by a large number of identical components. Consider, for instance, a screw of a certain type, with a specific product number, which is used as object ID in a database. Let us assume that the screw occurs 100 times in a construction that is stored in the database. Every time the screw appears it will then have the same ID, which means that there is no satisfactory way of distinguishing between the screws.

One way of dealing with this problem is to connect the product number of the screw to a plurality of positions. However, there is still no way of connecting a document to a specific occurrence of an object since the connection between document and object is based on the ID of the object.

OBJECT OF THE INVENTION

One object of the present invention is to provide an improved database for handling objects.

A second object of the invention is to provide a method for assigning an object ID which facilitates the creation of an improved database structure.

A third object of the invention is to provide a substantially automatic method for standardised assignment of unique object IDs.

A fourth object of the invention is to provide a method for assigning object IDs that will facilitate searching in the database.

A fifth object of the invention is to achieve compatibility between databases.

SUMMARY OF THE INVENTION

The present invention relates to a method for assigning an identity to an object in a database, which object has an extension that includes a plurality of coordinate points in a coordinate system representing a multidimensional reality, which method is characterised by the steps of selecting one of the object's coordinate points and assigning the object an identity based on said coordinate point.

That the object identity is based on a coordinate point in accordance with the invention means that each object is assigned an object ID that explicitly or implicitly provides information as to the position of the object in the coordinate system, or at least one of the object's coordinate points.

Thus, when a component is entered at several places in the coordinate system, each occurrence of the component is assigned a unique object ID and a new object is entered into the database.

The connection between each object ID and a coordinate can be utilised in the structure of the database to achieve faster data processing. The objects can be sorted, for instance, in accordance with the coordinates related to the object IDs, so that the structure becomes easier to search.

In large systems it is normal for a database to be divided into a large number of units which may be located in a plurality of physical storage units, e.g. computer discs. Assigning object IDs in accordance with the invention then enables the coordinate information of each object to determine in which unit it shall occur. This structuring ensures that objects located close to each other in the coordinate system are also in all likelihood stored in the same unit.

One advantage of this is that objects located near each other can be found more quickly in the database. Another advantage of this type of structure is that it becomes possible to easily discover which objects are located in a particular area of a factory, for instance.

According to known technology, in which the object ID is a serial number containing no information, it is considerably more difficult to achieve such a division of database objects.

In a preferred embodiment of the invention the coordinate point is selected in a predetermined manner, that follows specific rules and is common to all objects. This ensures consistency in the database. Thus, all that is required to determine the extension of the object in the coordinate system is information as to the object ID, the point-based model describing the object and possibly a transformation matrix.

The step of selecting a point may then comprise the steps of identifying a first subset of coordinate points having an extreme value in one of the dimensions of the coordinate system; if said subset comprises more than one coordinate point, further identifying from said subset a second subset of object points having an extreme value in a second of the dimensions of the coordinate system, and repeating the preceding steps until a subset consisting of a single coordinate point has been identified.

It is normally sufficient to perform the selection in a suitably chosen dimension. However, several points with the same extreme value in one dimension may occur, and further selection may then be required.

The dimensions of the coordinate system are selected so that only one object occurs at each coordinate point, thus ensuring that a unique object ID is linked to each object. The dimensions preferably comprise the three spatial dimensions, the time dimension and some abstract dimension, e.g. to permit several alternative embodiments.

When one of the dimensions of the coordinate system consists of time, two object IDs may include identical spatial coordinates but different time coordinates. This enables an object to be replaced by a new object in the three-dimensional space, for instance, without the old object having to disappear from the database. Instead, the two objects with IDs based on the same spatial coordinates but with different time coordinates can coexist.

In accordance with one embodiment of the invention the object identity is based on information as to when the object was entered into the coordinate system. Similarly, the identity may be based, if relevant, on information as to when the object ceases to be valid.

A consequence of this is that a new object ID is immediately created when an object is moved in the coordinate system or changed in some other way. When this occurs, the software considers this as two events, namely:

The existing object ceases to be valid, whereupon the time information relating to its object ID is extended to include information as to when the object ceased to be valid, A new object ID is created based on the new object. The ID of the new object is based on one of the spatial coordinate points of the object and time information specifying when the object was entered into the database.

One application of the invention is when the object is linked to a model drawn into a graphically represented coordinate system.

In accordance with one embodiment of the invention, each object represents a physical article, and particularly the geometric extension of this article. This is the case with CAD, for instance. In accordance with the invention each object ID then automatically relates a database object to a coordinate point comprising spatial coordinates and a time coordinate.

In accordance with one embodiment of the invention the ID of the object is linked to a time interval that specifies when the article exists in the reality represented by the coordinate system, i.e. the active time of the article.

When the time interval extends into the future the identity may be based on an index which permits the occurrence of several objects representing alternative future embodiments of the physical reality represented, which objects may have an overlapping extension in the coordinate system relating to time and space. The various alternatives may be considered as yet another dimension of the coordinate system.

This means that several units can coexist in the same place in the coordinate system relating to time and space, provided they are different alternative embodiments and thus have different indexes. An object need not therefore necessarily cease to be valid when it is changed or moved. Instead it may constitute an alternative to the new object, these two objects being assigned different indexes.

BRIEF DESCRIPTION OF THE DRAWINGS

The present invention will be described in more detail in the following with reference to the accompanying drawings illustrating preferred embodiments of the invention by way of example.

DESCRIPTION OF A PREFERRED EMBODIMENT

Figure 1:
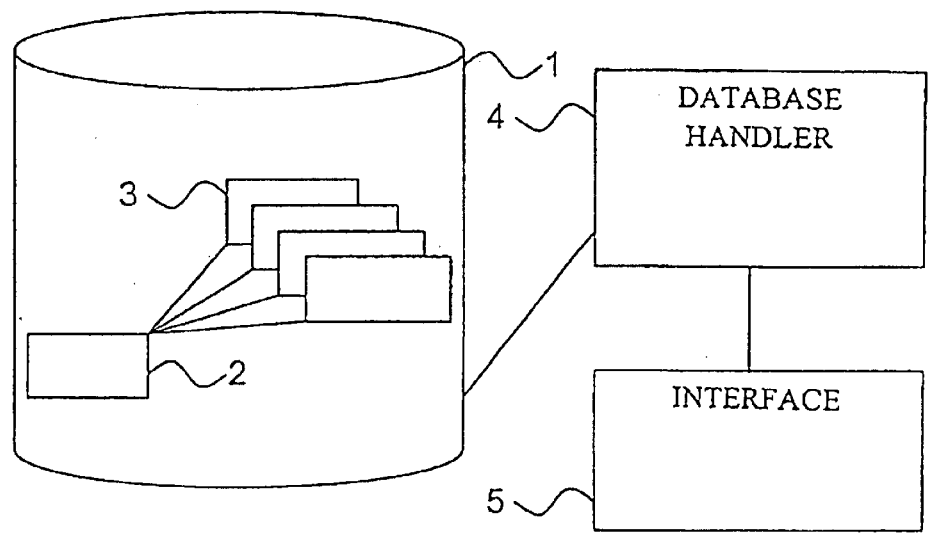
FIG. 1 illustrates schematically an environment in which the method in accordance with the invention may be used.

The method in accordance with the invention is applied in a computer environment comprising a database 1 with a plurality of objects 2. Each object is linked (e.g. by pointers) to one or more documents 3 describing the object. First software 4 to handle the objects in the database and second software 5 comprising a user interface are also shown. Said first and second software units may naturally be integrated in a software unit 6 and will be referred to generally in the following as the "software" 6.

The method in accordance with the invention is intended to be implemented in the software 6 or in separate software cooperating with one or more databases.

The software 6 permits a user to create, edit and remove objects 2, and continuously handles the database in accordance with the changes and in accordance with a specific structure. The software 6 is also arranged, for instance, to be able to perform searches in the database and handle relations between objects. An environment of this type occurs in a multitude of applications, such as CAD or the global database called WWW.

To assign a database object 2 an identity in accordance with the invention, the object is related to a defined coordinate system having several dimensions, and one of the object's coordinate points is selected, preferably in predetermined manner. The identity comprises the coordinates for this point.

The dimensions preferably constitute the three spatial dimensions, time, and an abstract dimension e.g. to describe alternative embodiments of a component or process. The method of assigning an ID to the object is illustrated in this case in FIGS. 2–3.

When an object is entered into the database it is linked to a graphic model created previously, possibly via a transformation matrix defining how the object is oriented in relation to the graphic model. This model, drawn in a CAD program, for instance, is suitably converted to point-based form, so-called tessellated form. The object then comprises the existence of a point-based model in a coordinate system and it can be said that the object has an extension in the coordinate system.

Figure 2:
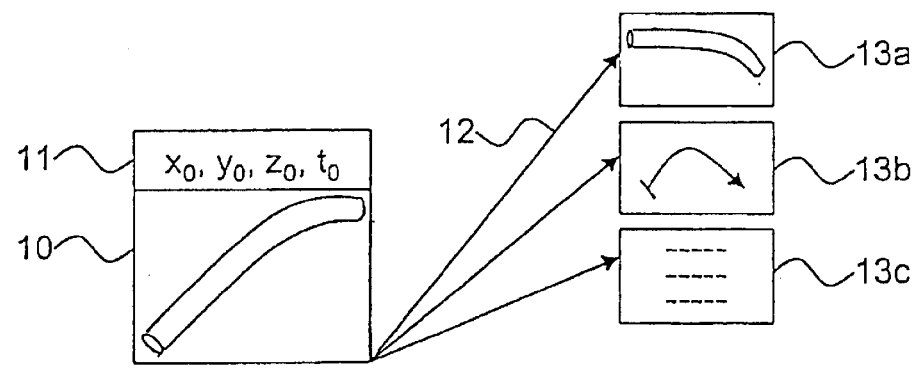
FIG. 2 shows the form of an object ID, and how this is linked to descriptive documents.

FIG. 2 illustrates schematically how the object 10 is linked by pointers 12 to one or more documents 13, that is to say, to the information describing the object 10. A document 13a may include the tessellated model mentioned above, a second document 13b may contain a transformation matrix, and a third document 13c may describe the material properties of the object.

Figure 3:
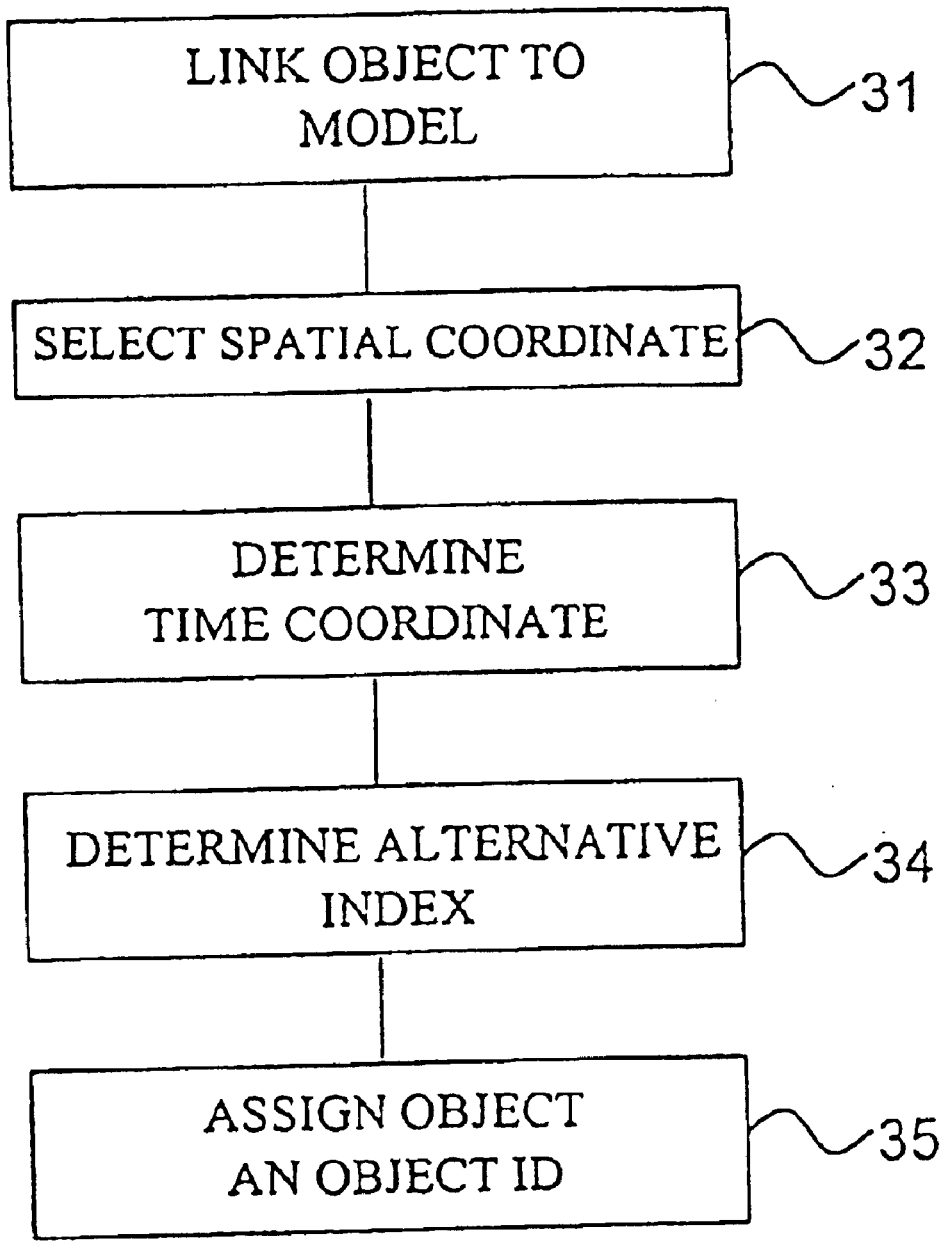
FIG. 3 shows a flow chart illustrating the method in accordance with the invention.

The step of linking an object to a model is designated 31 in FIG. 3. Thereafter one of the spatial coordinate points of the object is selected in step 32, time information indicating, for instance, when the object was entered into the database is determined in step 33 and, if relevant, an alternative index for the object 10 is determined in step 34. In step 35 the object 10 is then assigned an ID 11 based on these coordinates.

The object ID is formed on the basis of the coordinates for the selected coordinate point. In the simplest case the coordinates may simply be allowed to be included explicitly in the object ID 11, for instance in the form x, y, z, $t_0$, i. Another possibility is for the coordinates to be included in an implicit manner. However, it is important that a one-to-one mapping exists between ID and coordinate point, and that this coordinate point is wholly unique. This relationship is utilised in the structure of the database.

When two alternative objects are entered into the database it is advisable to be able to distinguish between the objects by having them associated with different time intervals representing an active time for the object, e.g. a time interval when the object occurs in a production series. If an index i is included in the object ID, this is related to an active time for the object. It is naturally possible instead to have the active time interval replace the index i in the object ID. The identity of the object will then be in the form x, y, z, $t_0$, $T_0$, $T_1$.

The following is a more detailed description of how the choice of coordinates can be performed, as well as what the coordinates represent.

One way of determining one of the spatial coordinates of the object is to search the number of points in the point-based model, as it has been placed in the coordinate system, in order to isolate an object point representing an extreme value.

Figure 4:
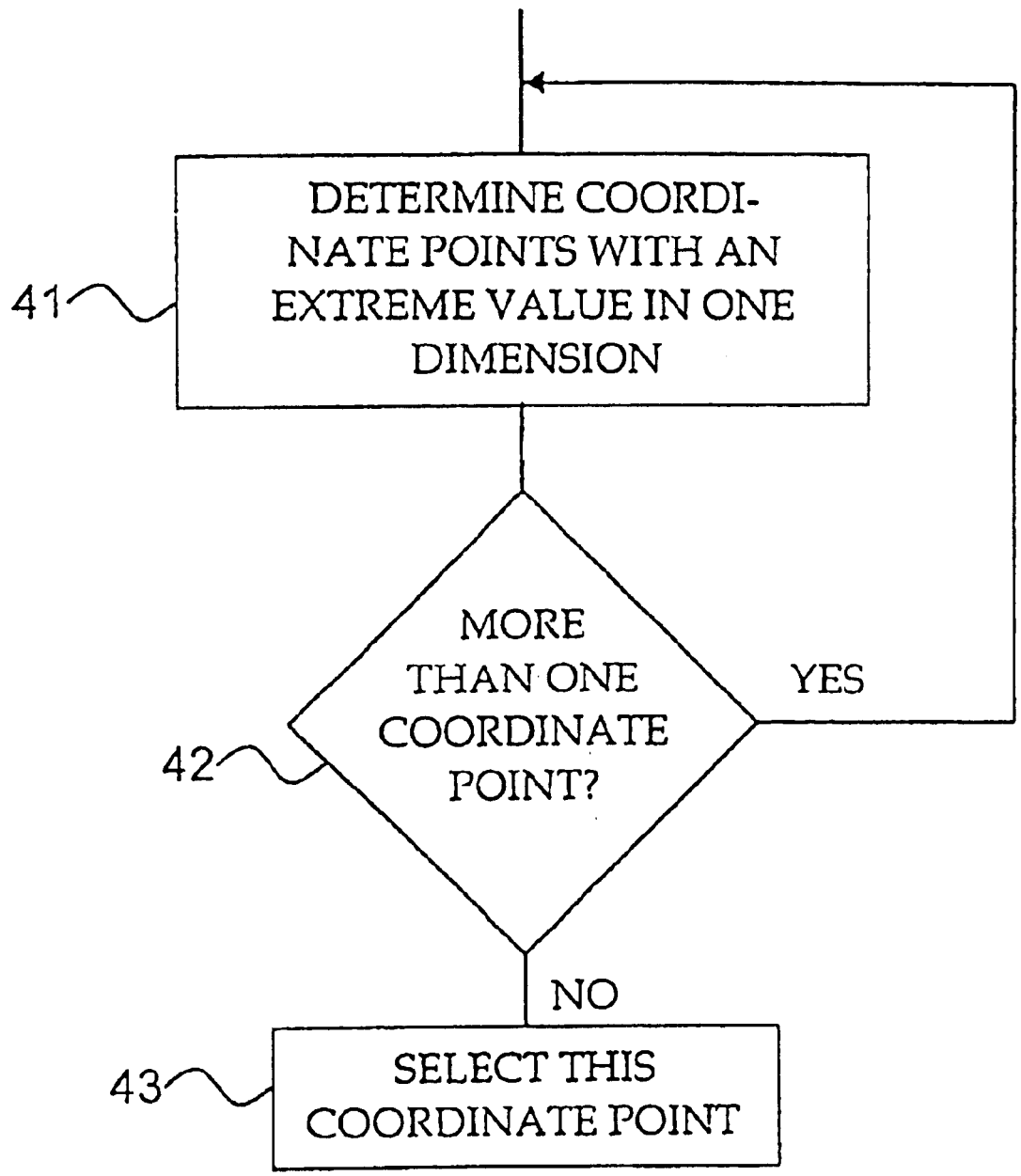
FIG. 4 shows a flow chart over an example of a method of selection in accordance with the invention.

The routine illustrated in FIG. 4 achieves this by considering one dimension at a time. First the coordinate points that have an extreme value in one dimension are determined in step 41 and then a check is made in step 42 to see whether more than one point has been encountered. If so, the program check returns to step 41 in order to decide which of these coordinate points has or have an extreme value in a second dimension, whereupon step 42 is repeated. When the loop 41–42 has been run through a sufficient number of times, a single point will have been isolated and this is chosen in step 43 as the coordinate point on which the object ID is to be based.

In the case of three spatial dimensions, represented by x-, y- and z-directions, the procedure could be performed as follows: A subset of coordinate points for which the x-coordinate is least is selected first. Thereafter the points for which the y-coordinate is least, are selected from these points. Finally the point for which the z-coordinate is least is selected from these points. It is of course possible, even probable, that a single point is isolated at the first selection. The following selections may then be omitted. The important thing is for the procedure to isolate one point from the many points in the geometric model, and that this point is selected in accordance with predetermined principles. A procedure in accordance with the above is simple for one skilled in the art to program.

Naturally the choice of a coordinate point can be performed even without the model being converted to tessellated form, but there is then a risk of the process becoming more complicated.

According to the embodiment described here the object ID as above also includes a time coordinate consisting of the time when the object was entered into the database. It may also be advisable, if relevant, for the object to be linked to a second time coordinate indicating when the object ceased to be valid. However, this time coordinate need not necessarily be included in the object ID but may constitute a property of the object.

Finally, if relevant, the identity includes an index representing alternative objects. This index enables several objects with overlapping extension in time and space to be present in the database. The various objects may then be assigned different indexes and at the same time be associated with time intervals representing an active time when the article represented by the object will be used. As long as these intervals do not overlap there is no conflict in allowing two objects to have otherwise overlapping extension. They are still unique since they are not active simultaneously.

Every time an object is changed, due to a change in design, for instance, or if it is moved, it will be re-entered into the database. The object will therefore acquire a new birth time and thus a new ID. In the case of spatial displacement, the new identity will also have new spatial coordinates.

Every time a user changes an object and re-enters it into the database, therefore, a new object ID is created. In accordance with the invention the user has two alternatives as regards the relationship of the new object to the old one:

1. The earlier object is provided with a time coordinate indicating that the object is no longer valid, which time coordinate consists of the time when the new object was entered.
2. The new object is assigned an index distinguishing it from the earlier one, and both objects continue to be valid in the database and represent alternative future embodiments.

Figure 5:
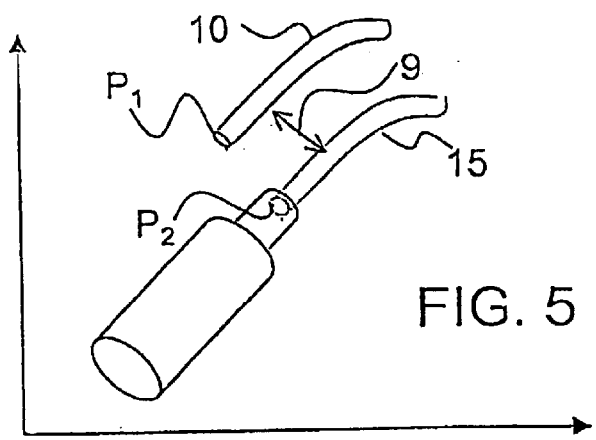
FIG. 5 shows how an object is moved in a coordinate system.

FIGS. 5–6 illustrate what happens when an object is moved. When the object is moved the distance a, which occurs at the time $t_1$, the point $P_0$ is moved to point $P_1$. A new object 15 is thus entered into the database with an identity 16 comprising the coordinates for the point $P_1$ and the time $t_1$. The new object may be linked to the same documents 13 as the object 10, or may be linked to copies of these documents. A third alternative is for the object 15 to be linked to the object 10 and in effect, therefore, it is a copy of this object.

At the same time the user is offered two possibilities, which are described below with reference to FIGS. 6a-b.

Figure 6A:
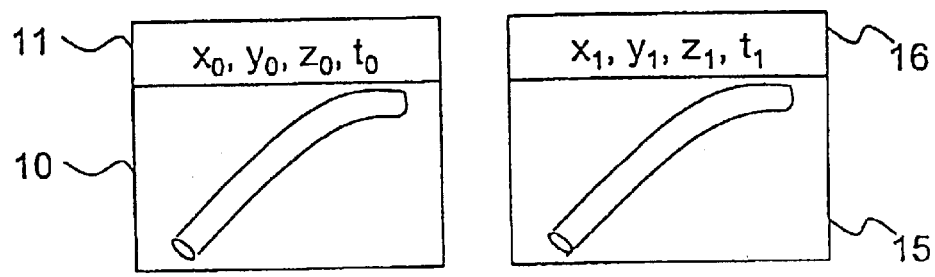
FIG. 6a shows possible handling of an object ID in connection with the object being moved in accordance with FIG. 5.

FIG. 6a illustrates the situation when the object 10 ceases to be valid. The object 10 is then linked to a second time $t_1$, and retains its ID 11 in the form $x_0, y_0, z_0, t_0$. If desired, the time $t_1$ may be included in the ID 11 of the object 10. The ID 16 of the object 15 comprises the coordinates $x_1, y_1, z_1, t_1$.

Figure 6B:
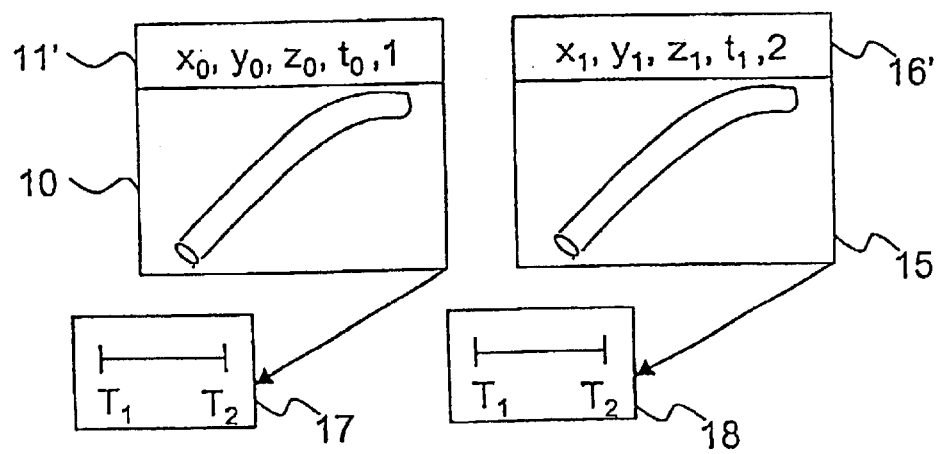
FIG. 6b shows a second possible handling of the object ID in connection with the object being moved in accordance with FIG. 5.

FIG. 6b illustrates the second possibility, namely that both objects remain valid but as different alternatives. An index, e.g. 1, is added to the ID 11' of the earlier object 10 which therefore takes the form $x_0, y_0, z_0, t_0, 1$. This object 15 is assigned an ID 16' with a different index, e.g. 2, and takes the form $x_1, y_1, z_1, t_1, 2$. A time interval 17, 18 may also be linked to each object, indicating the period of time during which the object exists in reality.

In practice the above procedure is performed by the user changing a graphic representation of an article in a first stage through the interface, without the database being affected. The user then gives a command to the software for the changes to be transferred to the database, whereupon handling of the object ID and object takes place. The user is also offered the opportunity of choosing between the two different alternatives, depending on whether the object is to cease to be valid or not.

The above procedure is naturally exactly analogous if the object is to be changed in some way other than by being moved, in which case the spatial coordinates $(x_0, y_0, z_0)$ of both the object IDs may be the same. It is naturally also possible for the new object 15 to be linked to other documents than the object 10, for instance if it has been turned in relation to the object 10 and thus has a different transformation matrix, or if the geometric model has been changed.

Figure 7:
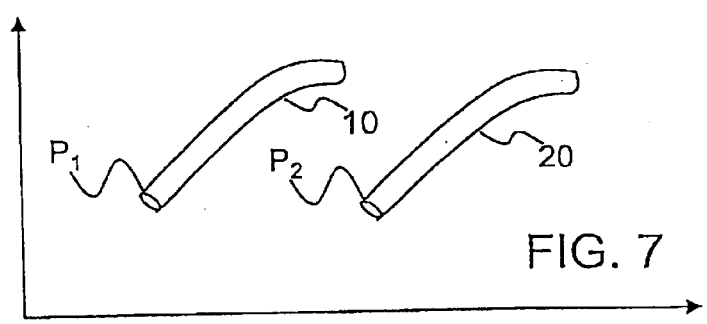
FIG. 7 shows how an object is copied in a coordinate system.
Figure 8:
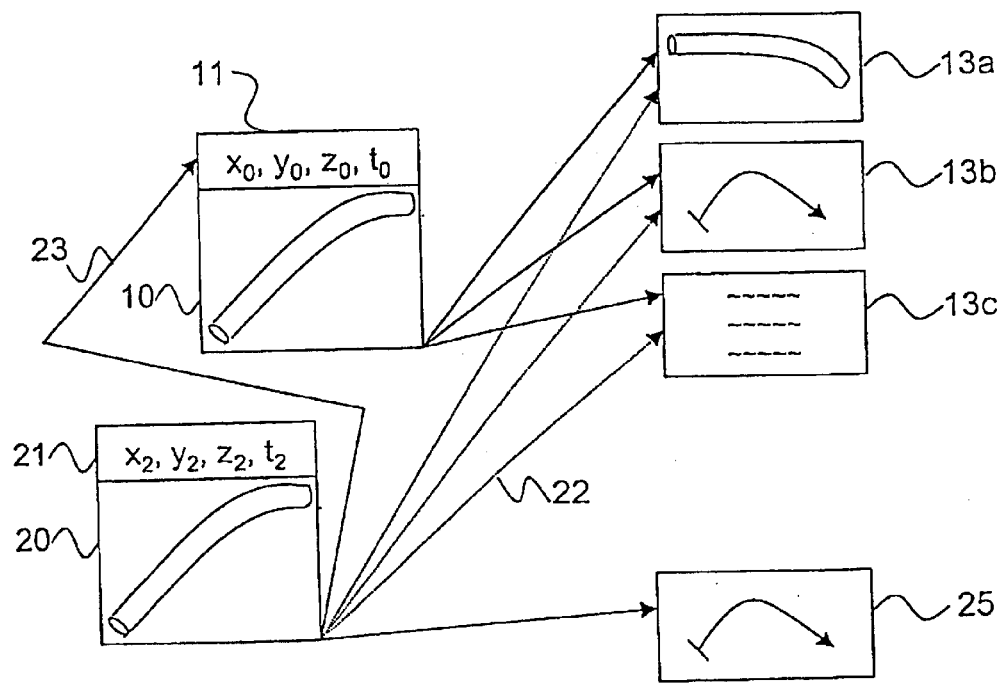
FIG. 8 shows the handling of an object ID in connection with copying in accordance with FIG. 7.

Referring now to FIGS. 7 and 8 a description will be given of how the database handles the situation when a user copies an object, and thus desires a second appearance of an existing component or article.

When the object 10 in FIG. 7 is copied at time $t_2$ to a new position $P_2$, a new object 20 is created which is assigned a new, unique ID 21, based on the coordinates in the point $P_2$ and the time $t_2$. This object 20 may either be linked by pointers 22 to the same descriptive documents 13 as the original object 10 or, preferably, be linked by a pointer 23 to the ID 11 of the original object 10. Yet another possibility is for the object 10 to be linked to copies of the documents 13 if this is advantageous.

It is sometimes desirable to create a copy of an earlier object, but where the new object shall be transformed in some way. The new object 20 may then be linked by a pointer 24 to a transformation matrix 25. In a simple case the transformation is pure mirroring, which is usual in a design (left or right components).

When several objects are linked together, larger combined objects are created. According to the invention these are also assigned an object ID in accordance with the same principles as those described above. This object ID is connected to the IDs of the component objects by pointers, and this combined object thus inherits the properties of the component objects.

In the above description of one embodiment of the invention the objects represent physical articles which are depicted by a user in a graphic interface. A plurality of CAD programs, known per se, function in this manner. This shall not be seen as a limitation of the invention, which can also be used in other types of databases such as databases with HTTP documents such as WWW. The important feature is that each database object has a unique occurrence in some form of coordinate system and that this occurrence is utilised when assigning an identity to the object.

In the example described above, the coordinate system may also be said to have five dimensions: namely the three spatial dimensions, time and alternative. However, the invention shall not be limited to this example and the dimensions of the coordinate system could consist of an optional combination of dimensions—spatial as well as abstract.

The method may be applied, for instance, in a coordinate system comprising only one spatial dimension (x), time and alternative. This coordinate system could be used to describe trains on a railway line. The coordinates of each train are determined by its position along the line, a point in time and, if relevant, an alternative index. For two trains to have the same spatial position in an overlapping time interval they must have different alternative indexes. In reality this corresponds to the railway line having parallel tracks, each representing different alternatives.

A further development of the invention is for an object in a process area in which articles are moved, to be assigned an ID. According to the invention, an object moving in the area may be represented by a plurality of objects, each of which is associated with an extension in the area and a time interval. The extension in the timespace, the "envelope", can then easily be studied by creating several objects by dividing the time interval into smaller intervals.

In a situation where two envelopes collide, such breaking-down or division into several objects may result in it being revealed that the collision does not occur.

What is claimed is:

1. A method for assigning an identity to an object (10) in a database (1), which object includes a plurality of coordinate points in a coordinate system representing a multidimensional reality, characterised by identifying a first subset of the object's coordinate points that have an extreme value in one of the dimensions of the coordinate system (step 41);

if said subset includes more than one coordinate point (step 42), further identifying from said subset a second subset of object points that have an extreme value in a second of the dimensions of the coordinate system (step 41);

repeating the preceding steps until a subset consisting of a single coordinate point ($P_0$) has been identified; and assigning the object an identity (11) based on the coordinates ($x_0$, $y_0$, $z_0$, $t_0$) of said coordinate point ($P_0$) so that a one-to-one mapping exists between the identity (11) and the coordinate point ($P_0$).

2. A method as claimed in claim 1, wherein one of dimensions of the coordinate system is time.

3. A method as claimed in claim 2, wherein the identity (11) is based on information as to the time ($t_0$) when the object was entered into the coordinate system.

4. A method as claimed in claim 3, wherein the identity (11) is based, if relevant, on information as to the time ($t_1$) when the object ceases to be valid.

5. A method as claimed in any one of claims 1 through 4, wherein the object is linked to a model drawn into a graphically represented coordinate system.

6. A method as claimed in any one of claims 1 through 4, wherein the object represents a physical object.

7. A method as claimed in claim 6, further comprising the step of allowing the identity (11) to be linked to a time interval (17, 18) that specifies during which space of time the physical object exists in the reality represented by the coordinate system.

8. A method as claimed in claim 7, further comprising the step of, when the time interval (17, 18) extends into the future, allowing the identity (11) to comprise an index (i) which permits the occurrence of several objects representing alternative future embodiments of the physical reality represented, which objects may have an overlapping extension in the coordinate system relating to time and space.

9. A method as claimed in any one of claims 1 through 4, wherein the identity (11) explicitly comprises the coordinates of the coordinate point, e.g. in the form $k_1$, $k_2$, $k_3$, $k_4$ where $k_i$ is the coordinate in dimension i.

* * * * *